United States Patent
Ramaraju et al.

(10) Patent No.: US 7,193,924 B2
(45) Date of Patent: Mar. 20, 2007

(54) DUAL-PORT STATIC RANDOM ACCESS MEMORY HAVING IMPROVED CELL STABILITY AND WRITE MARGIN

(75) Inventors: Ravindraraj Ramaraju, Round Rock, TX (US); Prashant U. Kenkare, Austin, TX (US); Jogendra C. Sarker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 11/123,514

(22) Filed: May 6, 2005

(65) Prior Publication Data

US 2006/0250880 A1    Nov. 9, 2006

(51) Int. Cl.
*G11C 8/00* (2006.01)
*G11C 7/10* (2006.01)
(52) U.S. Cl. .................... 365/230.05; 365/230.06; 365/189.08
(58) Field of Classification Search ............ 365/230.05
See application file for complete search history.

(56) References Cited

U.S. PATENT DOCUMENTS

| | | | |
|---|---|---|---|
| 5,502,683 A * | 3/1996 | Marchioro | 365/230.05 |
| 5,710,742 A | 1/1998 | Carter et al. | |
| 5,757,689 A * | 5/1998 | Seno | 365/72 |
| 5,761,146 A * | 6/1998 | Yoo et al. | 365/230.03 |
| 5,826,056 A * | 10/1998 | Noda | 711/167 |
| 5,828,597 A | 10/1998 | Madan | |
| 6,885,608 B2 * | 4/2005 | Nagano | 365/230.05 |

OTHER PUBLICATIONS

Quin, Hulfang et al, "SRAM leakage suppression by minimizing standby supply voltage", Aug. 24, 2004, IEEE, 5th International Symposium on Quality Electronic Design, pp. 55-60, 2004.*

* cited by examiner

*Primary Examiner*—Amir Zarabian
*Assistant Examiner*—Michael Weinberg
(74) *Attorney, Agent, or Firm*—Daniel D. Hill; James L. Clingan, Jr.

(57) ABSTRACT

A dual-port memory includes a plurality of memory cells coupled to a row decoder and column logic. Each memory cell includes two storage nodes, where each storage node is coupled to a bit line via an access transistor. Each memory cell also includes a logic gate for logically combining a word line signal with a column address signal and providing the resulting output signal to the gates of the access transistors. In one embodiment, the logic gate is a NOR logic gate and in another embodiment, the logic gate is a transmission gate. This prevents a potential read disturb problem with unselected memory cells of a row. This also reduces power consumption in the memory.

10 Claims, 3 Drawing Sheets

DUAL-PORT STATIC RANDOM ACCESS MEMORY HAVING IMPROVED CELL STABILITY AND WRITE MARGIN

FIELD OF THE INVENTION

This invention relates generally to integrated circuit memories, and more particularly to a dual-port static random access memory having improved cell stability and write margin.

RELATED ART

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft error, and power supply fluctuations which may cause the cell to inadvertently change logic states. Also, the SRAM cell must provide good stability during read operations without harming speed or the ability to write to the cell.

In a six transistor SRAM cell, an alpha ratio is defined as the width of a PMOS load transistor divided by the width of an NMOS access transistor. A beta ratio is defined as the width of an NMOS pull-down transistor divided by the width of the NMOS access transistor. The alpha and beta ratios are used to describe a SRAM cell's stability against the influences of factors such as power supply fluctuations, noise, and process variations. Generally, increasing the alpha and beta ratios improves cell stability. However, improving stability comes at the expense of lower write performance.

A dual-port SRAM generally has separate read and write ports. Adjusting the beta ratio of the read port to optimize cell stability may adversely affect the write margin of the write port. Likewise, adjusting the beta ratio of the write port to optimize the write margin may adversely affect the cell stability as seen by the read port.

Therefore, there is a need for a dual-port SRAM having improved cell stability without decreased write margins.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Generally, the present invention provides a dual-port integrated circuit memory that includes a logic gate for receiving a column address signal and a word line signal for selectively enabling an access transistor of a memory array. In one embodiment, the logic gate is a NOR logic gate. In another embodiment, the logic gate is a transmission gate. By logically combining the word line signal with the column address signal to control the memory cell access transistors, both the write port and the read port of the memory cell can be separately optimized for both write margin and cell stability in a dual-port memory that allows a portion of a row that is less than a cache line to be accessed.

Figure 1:
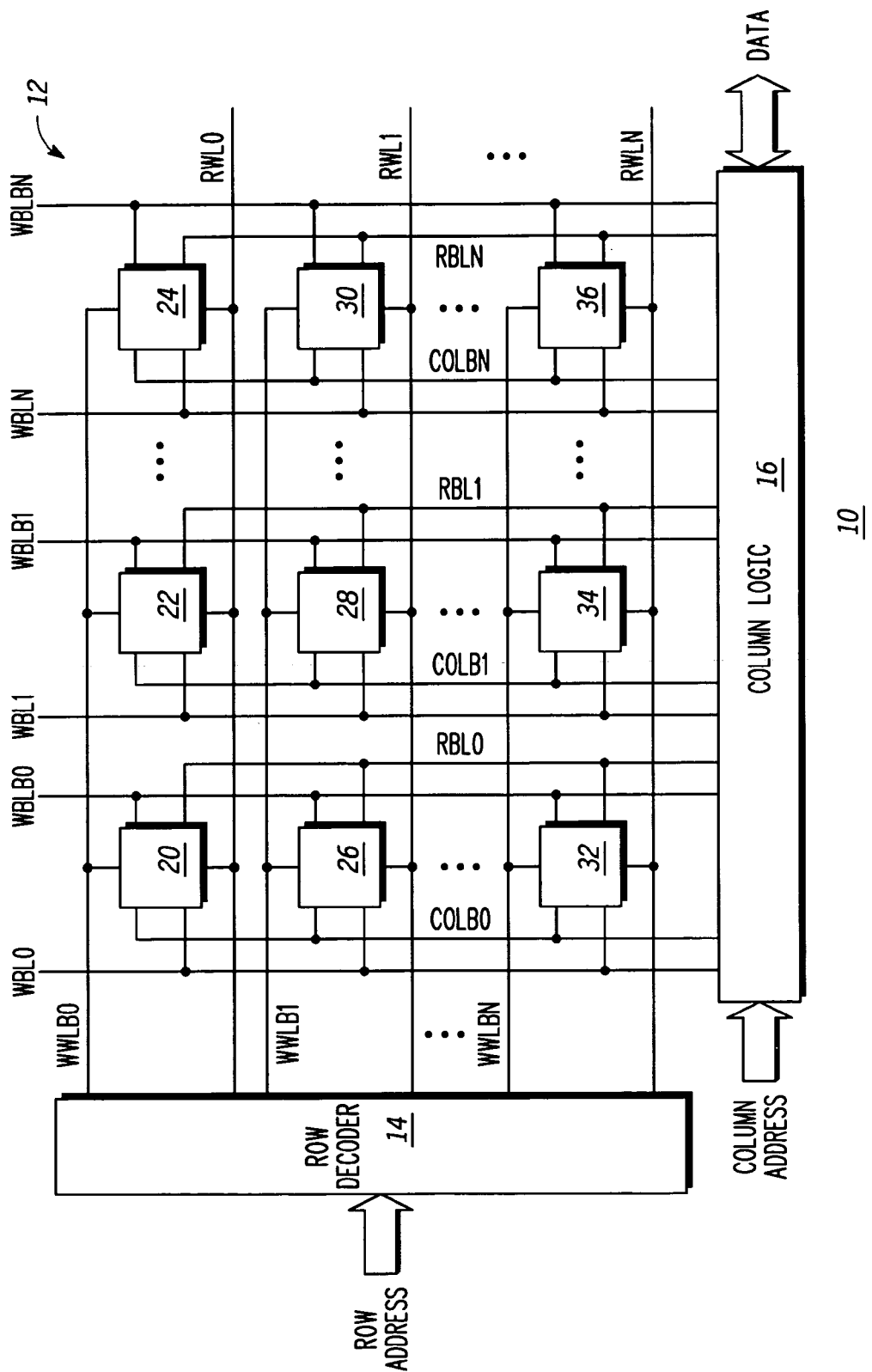
FIG. 1 illustrates, in block diagram form, a dual-port integrated circuit memory in accordance with an embodiment of the present invention.

FIG. 1 illustrates, in block diagram form, a dual-port integrated circuit memory 10 in accordance with an embodiment of the present invention. Generally, memory 10 includes a plurality of memory cells 12, a row decoder 14, and column logic 16. The plurality of memory cells 12 includes representative memory cells 20, 22, 24, 26, 28, 30, 32, 34, and 36. As illustrated in FIG. 1, each of the memory cells is coupled to one of a plurality of write word lines labeled "WWLB0" to "WWLBN", to one pair of a plurality of pairs of write bit lines labeled "WBL0/WBLB0" to "WBLN/WBLBN", to one of a plurality of read word lines labeled "RWL0"–"RWLN", to one of a plurality of read bit lines labeled "RBL0" to "RBLN", and to one of a plurality of column enable signals labeled "COLB0" to "COLBN". The memory cells 12 are implemented in rows and columns. For example, memory cells 20, 22, and 24 and the word line WWLB0 form one row of memory cells. Likewise, memory cells 20, 26, and 32 form one column of memory cells.

The row decoder 14 has an input for receiving a row address labeled "ROW ADDRESS", and a plurality of output terminals coupled to the plurality of write word lines WWLB0 to WWLBN. The read word lines RWL0–RWLN are coupled to row decoder 14. The column logic 16 has an input terminal for receiving a column address labeled "COLUMN ADDRESS", a first plurality of terminals coupled to write bit line pairs WBL0/WBLB0–WBLN/WBLBN, a second plurality of terminals coupled to read bit line pairs RWL0–RWLN, and a plurality of input/output (I/O) terminals for receiving or providing data signals labeled "DATA". As illustrated in FIG. 1, the read bit lines, write bit lines, and column select lines run in the column direction, and the write word lines and read word lines run in the row direction. Column logic 16 includes, for example, column decoders, sense amplifiers, bit line equalization and precharge circuits, and buffer circuits. Note that in the illustrated embodiment, the sense amplifiers for a read operation are single-ended. In another embodiment not illustrated in FIG. 1, the sense amplifiers may be differential.

Memory 10 is implemented as a cache memory in a data processor. The column decoders of column logic 16 select which of the memory cells are to receive or provide data. In one mode, as determined by address signals COLUMN ADDRESS, all of the memory cells coupled to a selected one of write word lines WWLB0 to WWLBN are enabled to receive data signals from the bit lines. In another mode, a selected portion of less than all of the memory cells coupled to a write word line are enabled to receive data signals from the bit lines. In the illustrated embodiment, the value of address signals COLUMN ADDRESS determines which memory cells of a row are selected to receive data during a write operation or to provide data during a read operation.

Figure 2:
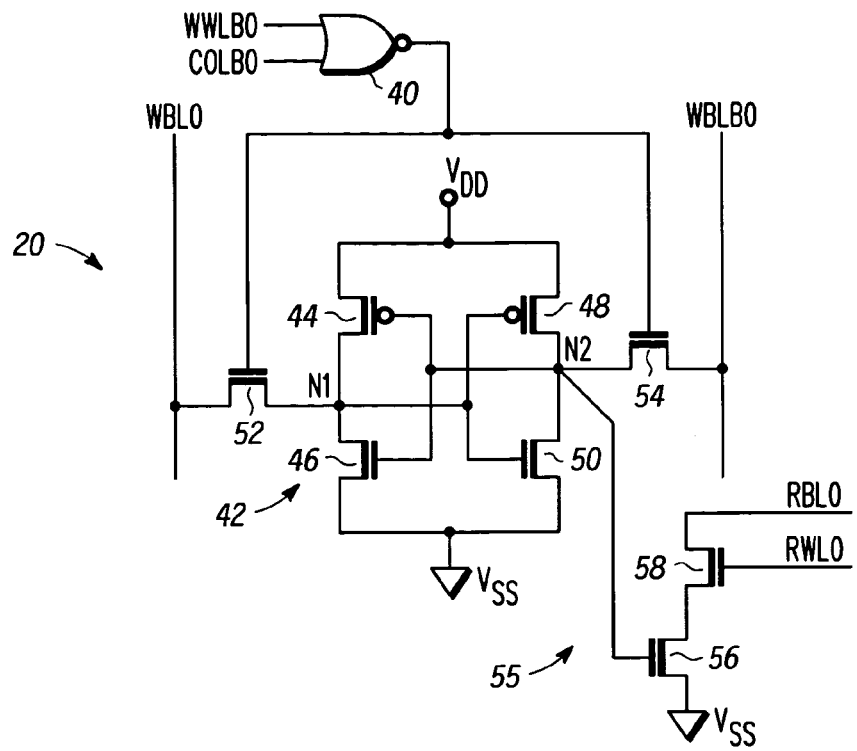
FIG. 2 illustrates, in schematic diagram form, one embodiment of a memory cell of the memory of FIG. 1.

FIG. 2 illustrates, in schematic diagram form, the memory cell 20 of the memory of FIG. 1 in accordance with one embodiment the present invention. The memory cell 20 is a dual-port SRAM cell and includes a storage cell 42, access transistors 52 and 54, a NOR logic gate 40, and a read port 55. Read port 55 is for providing a single-ended data signal and includes transistors 56 and 58. In the illustrated embodiment, storage cell 42 is a cross-coupled pair of inverters. One inverter of the cross-coupled pair of inverters 42 includes a P-channel transistor 44 and an N-channel transistor 46. The other inverter includes P-channel transistor 48 and P-channel transistor 50. Access transistor 52 couples a storage node N1 to the write bit line WBL0. Access transistor 54 couples a storage node N2 to the write bit line WBLB0. The read port 55 includes an N-channel transistor 56 having a gate coupled to the storage node N2, a drain, and a source coupled to a power supply voltage terminal labeled "VSS". N-channel transistor 58 has a source coupled to the drain of transistor 56, a gate for receiving read word line signal RWL0, and a drain coupled to read bit line RBL0.

The NOR logic gate 40 is implemented as part of memory cell 20 and has a first input for receiving write word line signal WWLB0, a second input for receiving column address signal COLB0, and an output coupled to the gates of access transistors 52 and 54. The output of the NOR logic gate 40 providing an enable signal for making transistors 52 and 54 conductive during a write operation. Both of signals WWLB0 and COLB0 are active low signals.

During a write operation to memory cell 20, a differential voltage is provided to bit line pair WBL0/WBLB0. Write word line signal WWLB0 and column address signal COLB0 are asserted as logic low voltages. In response, NOR logic gate 40 provides a logic high output signal to the gates of access transistors 52 and 54. Access transistors 52 and 54 then couple the storage nodes N1 and N2 to write bit lines WBL0 and WBLB0, respectively. The logic state provided to the storage nodes is latched by the cross-coupled pair 42. During a read operation to memory cell 20, the bit line RBL0 is precharged to a logic high voltage equal to the voltage provided at power supply voltage terminal VDD. The read word line RWL0 is asserted as a logic high voltage to cause transistor 58 to be conductive. If storage node N2 is storing a logic low voltage, N-channel transistor 56 is substantially non-conductive and the voltage on bit line RBL0 will remain a logic high. However, if storage node N2 is storing a logic high voltage, transistor 56 will be conductive, and the voltage on bit line RBL0 will be pulled to the voltage of power supply voltage terminal VSS. In the illustrated embodiment, VSS is at ground potential and VDD is provided with a positive power supply voltage. In the illustrated embodiment, VDD is one volt or less. In other embodiments, the supply voltages may be different.

In a typical embedded SRAM read or write operation, all of the memory cells of a row are accessed at the same time. However, some operating modes may require that less than all of the memory cells of a row be accessed. During a write operation of less than all of the memory cells of a row in a prior art cache memory, the storage nodes of all of the memory cells of a row are coupled to the bit lines, even when some of the memory cells are not written. In the prior art memory, the bit lines of the cells not written are precharged to VDD. However, unnecessarily coupling the unwritten memory cells to the precharged bit lines causes excessive power consumption and can cause the logic states of the unselected memory cells to be disturbed. That is, the storage node having the lower voltage is coupled to, and charged by the precharged bit line. By using NOR logic gate 40 to logically combine a word line signal with a column address signal for coupling a storage cell to a bit line, the use of precharge voltages on the write bit lines is avoided. Also, the memory cell 20 is easier to write to because there is only one access transistor between a storage node of the cell and a bit line.

Figure 3:
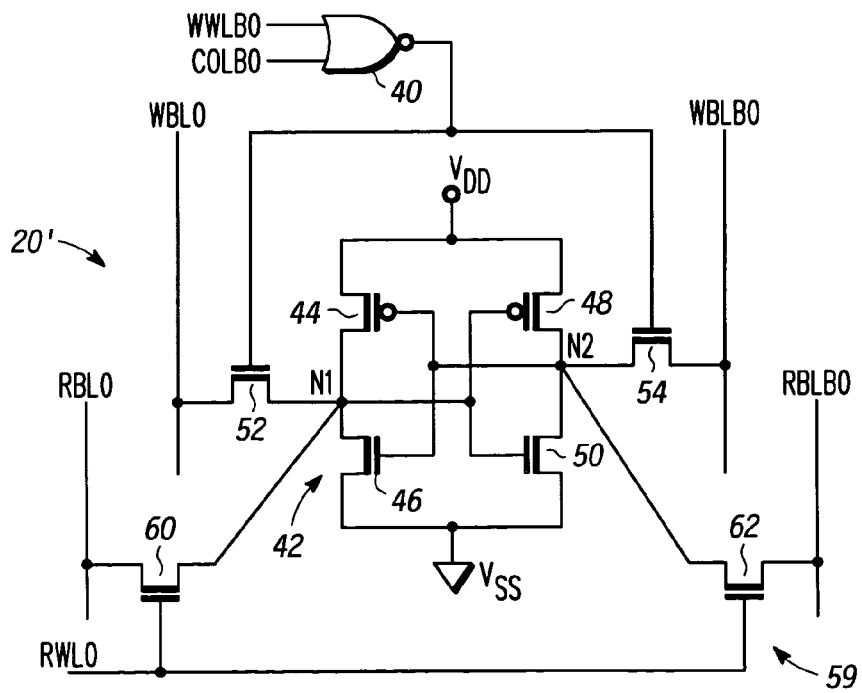
FIG. 3 illustrates, in schematic diagram form, another embodiment of a memory cell of the memory of FIG. 1.

FIG. 3 illustrates, in schematic diagram form, a memory cell 20' of the memory of FIG. 1 in accordance with another embodiment of the present invention. Note that the same reference numbers are used for the same or similar elements in the drawings. Memory cell 20' is generally the same as memory cell 20 of FIG. 2 except that memory cell 20' has a differential read port 59. Differential read port 59 includes access transistors 60 and 62 to couple storage nodes N1 and N2 to differential read bit lines RBL0 and RBLB0, respectively, in response to a logic high voltage on read word line RWL0. Otherwise, the memory cell 20' operates the same as memory cell 20 of FIG. 2.

Figure 4:
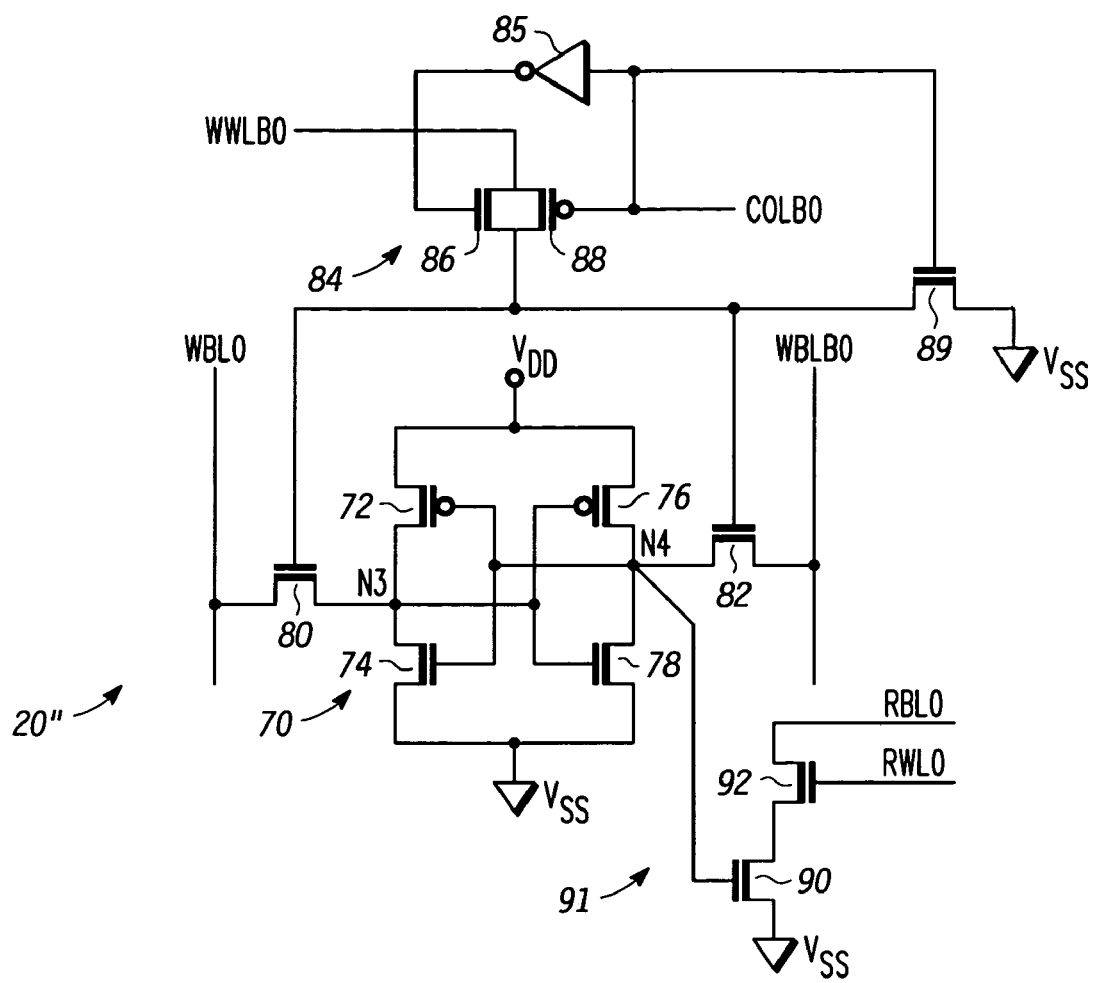
FIG. 4 illustrates, in schematic diagram form, another embodiment of a memory cell of the memory of FIG. 1.

FIG. 4 illustrates, in schematic diagram form, a memory cell 20" of the memory of FIG. 1 in accordance with another embodiment of the present invention. The memory cell 20" is a dual-port SRAM cell and includes a storage cell 70, access transistors 80 and 82, a transmission gate 84, and a read port 91. Read port 91 is for providing a single-ended data signal and includes transistors 90 and 92. In the illustrated embodiment, storage cell 70 is a cross-coupled pair of inverters. One inverter of the cross-coupled pair of inverters 70 includes a P-channel transistor 72 and an N-channel transistor 74. The other inverter includes P-channel transistor 76 and N-channel transistor 78. Access transistor 80 couples a storage node N3 to the write bit line WBL0. Access transistor 82 couples a storage node N4 to the write bit line WBLB0. The read port 91 includes an N-channel transistor 90 having a gate coupled to the storage node N4, a drain, and a source coupled to a power supply voltage terminal VSS. N-channel transistor 92 has a source coupled to the drain of transistor 90, a gate for receiving read word line signal RWL0, and a drain coupled to read bit line RBL0.

The transmission gate 84 includes an N-channel transistor 86 and a P-channel transistor 88 coupled together in parallel. A gate of transistor 88 receives column select signal COLB0 and a gate of transistor 86 receives a logical complement of address signal COLB0 via an inverter 85. Address signal COLB0 is active as a logic low signal. Note that in the illustrated embodiment, transmission gate 84 is logic circuit having parallel-connected CMOS (complementary metal-oxide semiconductor) transistors for providing a write enable signal to the gates of access transistors 80 and 82. However, in other embodiments, the logic circuit may be replaced with a different logic circuit comprising, for example, a single N-channel or P-channel transistor coupled to provide the write word line signal WWLB0 to the access transistor control terminals as determined by a logic state of the column select signal COLB0 or a logical complement of the column select signal COLB0.

A write operation to memory cell 20" of FIG. 4 is basically the same as write operation described above for memory cell 20 of FIG. 2, except that the write word line signals are active high instead of active low. When address signal COLB0 is a logic low voltage, transistors 86 and 88 of transmission gate 84 become conductive. A write word line voltage on write word line WWLB0 is provided to the gates of access transistors 80 and 82 to couple the storage nodes N3 and N4 to their respective bit lines during the write operation. A logic state on the bit lines is provided to the storage nodes and latched by the cross-coupled pair of inverters 70.

A read operation to memory cell 20" is the same as the read operation described above for memory cell 20. The bit line RBL0 is precharged to a logic high voltage equal to the voltage provided at power supply voltage terminal VDD. The read word line RWL0 is asserted as a logic high voltage to cause transistor 92 to be conductive. If storage node N4 is storing a logic low voltage, N-channel transistor 90 is substantially non-conductive and the voltage on bit line RBL0 will remain a logic high. However, if storage node N4 is storing a logic high voltage, transistor 90 will be conductive, and the voltage on bit line RBL0 will be pulled to the voltage of power supply voltage terminal VSS. In the illustrated embodiment, VSS is at ground potential. An N-channel transistor 89 has a gate coupled to receive address signal COLB0, a drain coupled to the gates of transistors 80 and 82, and a source coupled to VSS. When the address signal is inactive as a logic high voltage, transistor 89 is conductive and insures that the gates of transistors 80 and 82 do not float when memory cell 20" is not being accessed.

Note that the differential read port illustrated in FIG. 3 could also be used with the memory cells of FIG. 2 or FIG. 4. Also, note that in the illustrated embodiments, NOR logic gate 40, transmission gate 84, and inverter 85 are implemented as a portion of each memory cell. However, in other embodiments, NOR logic gate 40, transmission gate 84 and inverter 85 may be implemented separately from the memory cells. Also, each of the logic gates may be shared with any number of memory cells less than all of the memory cells of a row depending on how many memory cells are to be selected during a write operation, such as for example, a byte. In addition, the NOR logic gate 40 and transmission gate 84 may be used with a single-port memory instead of a dual-port memory.

While the invention has been described in the context of a preferred embodiment, it will be apparent to those skilled in the art that the present invention may be modified in numerous ways and may assume many embodiments other than that specifically set out and described above.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory, comprising:
   a row decoder;
   column logic; and
   a memory array coupled to the row decoder and the column logic, comprising:
      a plurality of memory cells arranged in rows and columns;
      a plurality of word lines, coupled to the row decoder, running in a row direction;
      a plurality of read bit lines, coupled to the column logic, running in a column direction that carry data that has been read from the plurality of memory cells;
      a plurality of write bit lines, coupled to the column logic, running in the column direction, wherein the write bit lines carry data for writing into the plurality of memory cells;
      a plurality of column selection lines, coupled to the column logic, running in the column direction;
      a plurality of logic circuits;
   wherein:
      each memory cell of the plurality of memory cells is coupled to a predetermined one of the plurality of logic circuits, a predetermined one of the read bit lines of the plurality of read bit lines, and a first predetermined one of the write bit lines of the plurality of write bit lines; and
      each logic circuit comprises;
         a transmission gate having a signal input coupled to a predetermined one of the plurality of word lines, a signal output coupled to a predetermined one of the memory cells, and a first control input coupled to a predetermined one of the plurality of column select lines;
         an inverter having an input coupled to the column select line and an output coupled to a second control input of the transmission gate; and
         a first transistor having a control input coupled to the column select line, a first current electrode coupled to a ground terminal, and a second current electrode coupled to the output of the transmission gate.

2. The memory of claim 1, wherein each memory cell has a first storage node and a second storage node.

3. The memory of claim 2, wherein each memory cell has a second transistor having a first current electrode directly connected to the first predetermined one of the write bit lines to which it is coupled, a second current electrode directly connected to a predetermined one of the first storage node and the second storage node, and a control electrode coupled to the logic circuit to which it is connected.

4. The memory of claim 3, wherein each memory cell has a read output circuit coupled to a predetermined one of the first storage node and the second storage node and coupled to the predetermined one of the read bit lines.

5. The memory of claim 4, wherein each memory cell has a third transistor having a first current electrode directly connected to a second predetermined one of the write bit lines, a second current electrode directly connected to the one of the first storage node, and a control electrode coupled to the signal output of the transmission gate.

6. The memory of claim 1 wherein the plurality of memory cells is powered by a power supply voltage not greater than about one volt.

7. A memory array, comprising:
   a plurality of write word lines running substantially in a first direction;
   a plurality of write bit lines running substantially in a second direction;
   a plurality of read bit lines running substantially in the second direction;
   a plurality of read word lines running substantially in the first direction;
   a plurality of memory cells;
   a plurality of column select lines running substantially in the second direction; and
   a plurality of logic circuits comprising:

a transmission gate having a signal input coupled to a first write word line of the plurality of word lines, a signal output coupled to the control gate of an access transistor of a corresponding one of the plurality of memory cells, a first control input coupled to a column select line of the plurality of column select lines, and a second control input;

an inverter having an input coupled to the first control input, and an output coupled to the second control input of the transmission gate; and a transistor having a control input coupled to the column select line, a first current electrode coupled to a ground terminal, and a second current electrode coupled to the output of the transmission gate;

wherein a memory cell of the plurality of memory cells comprises:

a storage cell having a first storage node and a second storage node;

a first access transistor having a first current electrode directly connected to a first write bit line of the plurality of write bit lines, a second current electrode directly connected to the first storage node, and a control electrode coupled to the column select line; and a read circuit, coupled to a first read word line of the plurality of word lines, that couples data from the storage cell to the read bit line.

8. The memory array of claim 7, wherein the first access transistor comprises an N channel transistor.

9. The memory array of claim 7, further comprising a plurality of complementary write bit lines, wherein the memory cell further comprises a second access transistor having a first current electrode directly connected to a first complementary write bit line of the plurality of complementary write bit lines, a second current electrode directly connected to the second storage node, and a control electrode coupled to the signal output of the transmission gate.

10. A memory array, comprising:

a plurality of write word lines running substantially in a first direction;

a plurality of write bit lines running substantially in a second direction;

a plurality of read bit lines running substantially in the second direction;

a plurality of read word lines running substantially in the first direction;

a plurality of memory cells;

a plurality of column select lines running substantially in the second direction; and a plurality of logic means, a logic means of the plurality of logic means comprising:

a transmission gate having a signal input coupled to a write word line of the plurality of write word lines, a signal output, a first control input coupled to a column select line of the plurality of column select lines, and a second control input;

an inverter having an input coupled to the first control input of the transmission gate, and an output coupled to the second control input of the transmission gate; and a transistor having a control input coupled to the column select line, a first current electrode coupled to a ground terminal, and a second current electrode coupled to the signal output of the transmission gate;

wherein a memory cell of the plurality of memory cells comprises:

a storage cell having a first storage node and a second storage node;

an access transistor having a first current electrode directly connected to a first write bit line of the plurality of write bit lines, a second current electrode directly connected to the first storage node, and a control electrode coupled to the signal output of the transmission gate; and read means for coupling data from the first storage cell to a first read bit line of the plurality of read bit lines.

* * * * *